(12) United States Patent
Ko et al.

(10) Patent No.: US 11,331,700 B2
(45) Date of Patent: May 17, 2022

(54) MANUFACTURING ENCLOSURE ENVIRONMENTAL CONTAINMENT SYSTEMS AND METHODS

(71) Applicant: KATEEVA, INC., Newark, CA (US)

(72) Inventors: Alexander Sou-Kang Ko, Santa Clara, CA (US); Prahallad Iyengar, Santa Clara, CA (US); Robert Dennis Taff, San Ramon, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 16/483,243

(22) PCT Filed: Apr. 10, 2018

(86) PCT No.: PCT/US2018/026943
§ 371 (c)(1),
(2) Date: Aug. 2, 2019

(87) PCT Pub. No.: WO2018/148765
PCT Pub. Date: Aug. 16, 2018

(65) Prior Publication Data
US 2019/0374985 A1    Dec. 12, 2019

Related U.S. Application Data

(60) Provisional application No. 62/457,774, filed on Feb. 10, 2017.

(51) Int. Cl.
| | | |
|---|---|---|
| *B08B 15/02* | (2006.01) | |
| *F24F 9/00* | (2006.01) | |
| *H01L 51/00* | (2006.01) | |
| *H01L 51/56* | (2006.01) | |

(52) U.S. Cl.
CPC ........... *B08B 15/02* (2013.01); *F24F 9/00* (2013.01); *H01L 51/0005* (2013.01); *H01L 51/56* (2013.01); *F24F 2009/005* (2013.01)

(58) Field of Classification Search
CPC ....... B08B 15/02; F24F 9/00; F24F 2009/005; F24F 3/167; H01L 51/0005; H01L 51/56
See application file for complete search history.

(56) References Cited

U.S. PATENT DOCUMENTS

| | | |
|---|---|---|
| 5,259,812 A | 11/1993 | Kleinsek |
| 5,912,184 A | 6/1999 | Young |
| 5,997,588 A | 12/1999 | Goodwin et al. |

(Continued)

OTHER PUBLICATIONS

International Search Report and Written Opinion dated Jun. 11, 2018 to PCT Application PCT/US2018/026943.

*Primary Examiner* — Natasha N Campbell
(74) *Attorney, Agent, or Firm* — Hauptman Ham, LLP

(57) ABSTRACT

What is disclosed herein are embodiments of an enclosed manufacturing system configured to provide a controlled process environment for various articles of manufacture requiring a controlled process environment, and additionally to contain a process environment within the enclosure during periods of external access to the interior of the enclosed manufacturing system. Various embodiments of manufacturing systems of the present teaching can contain the environment within a manufacturing enclosure so as to minimize the interaction of an environment external to a manufacturing enclosure with the internal enclosure environment.

19 Claims, 4 Drawing Sheets

(56) References Cited

U.S. PATENT DOCUMENTS

| | | | |
|---|---|---|---|
| 6,251,006 B1* | 6/2001 | Laborde | F24F 9/00 |
| | | | 454/189 |
| 7,465,225 B2* | 12/2008 | Ohmura | F24F 3/167 |
| | | | 454/187 |
| 2006/0180081 A1 | 8/2006 | Park | |
| 2007/0253831 A1* | 11/2007 | Lee | F24F 1/0071 |
| | | | 417/5 |
| 2008/0304944 A1 | 12/2008 | Sung et al. | |
| 2013/0206058 A1* | 8/2013 | Mauck | B41J 2/16523 |
| | | | 118/300 |

* cited by examiner

MANUFACTURING ENCLOSURE ENVIRONMENTAL CONTAINMENT SYSTEMS AND METHODS

CROSS-REFERENCE TO RELATED APPLICATIONS

This application is national stage application of the International PCT Application No. PCT/US2018/026943, filed internationally on Apr. 10, 2018, which claims the benefit of U.S. Provisional Application No. 62/457,774, filed Feb. 10, 2017, each of which is incorporated by reference herein in its entirety.

BACKGROUND

A variety of articles, such as electronic devices in a wide range of technology areas, for example, but not limited by, OLED displays, OLED lighting, organic photovoltaics, Perovskite solar cells, and organic semiconductor circuits, require a controlled process environment during manufacturing. The manufacture of various electronic devices may require a variety of manufacturing apparatuses for performing process steps such as deposition, drying, baking, curing, and packaging, in which each step requires a controlled process environment.

As such, a controlled process environment for such articles of manufacture may be isolated, separated, or otherwise contained from an external facilities environment, for example, in a manufacturing system that includes an enclosure or housing for maintaining a controlled process environment, including a controlled process gas environment.

When such a manufacturing system requires maintenance, and therefore access from an external facilities environment to the interior of the enclosed manufacturing system, it may be desirable to contain the environment within the enclosure from the external facilities environment.

In that regard, various environmental containment systems and methods of the present teachings provide a controlled process environment during various manufacturing processes, as well as containment of an environment within an enclosed manufacturing system from an external facilities environment when the enclosure is open to external access.

DETAILED DESCRIPTION

What is disclosed herein are embodiments of an enclosed manufacturing system configured to provide a controlled process environment for various articles of manufacture requiring a controlled process environment, and additionally to contain an internal environment within the enclosure during periods of external access to the interior of the enclosed manufacturing system. For example, the manufacture of various electronic devices may require a variety of manufacturing apparatuses for performing process steps such as deposition, drying, baking, curing, and packaging, in which each step requires a controlled process environment within an enclosed manufacturing system. External access to the enclosed manufacturing system may be done, for example, during maintenance on such manufacturing apparatuses. As such, it may be desirable to contain the internal environment within the enclosure during a maintenance procedure requiring external access to the interior of the enclosed manufacturing system.

Various enclosed manufacturing systems of the present teachings may have a controlled process environment such as including an atmosphere comprising a gas that is minimally reactive or non-reactive with one or more species deposited upon or comprising a substrate being processed, such gas having a specified purity level. Such a purity level can also include controlled maximum impurity concentrations of other species, such as oxygen, ozone, water vapor and organic solvent vapors, such as to prevent degradation of devices during fabrication or to inhibit or suppress defects. A controlled process environment of the present teachings may also include particulate controls, such as to maintain a specified particulate level within the controlled environment, as a controlled thermal and lighting environment.

In that regard, various embodiments of a manufacturing enclosure of the present teaching can be integrated with various components such as a gas circulation and filtration system, a particle control system, a gas purification system, a thermal regulation system and the like to provide manufacturing systems having a controlled process environment. Non-limiting examples providing disclosure of such manufacturing systems can be found in U.S. Pat. Nos. 8,899,171, 9,048,344, 9,343,678, US Published Application 2015/0314325 and US Published Application 2017/0004983, all of which are incorporated herein by reference.

Figure 1:
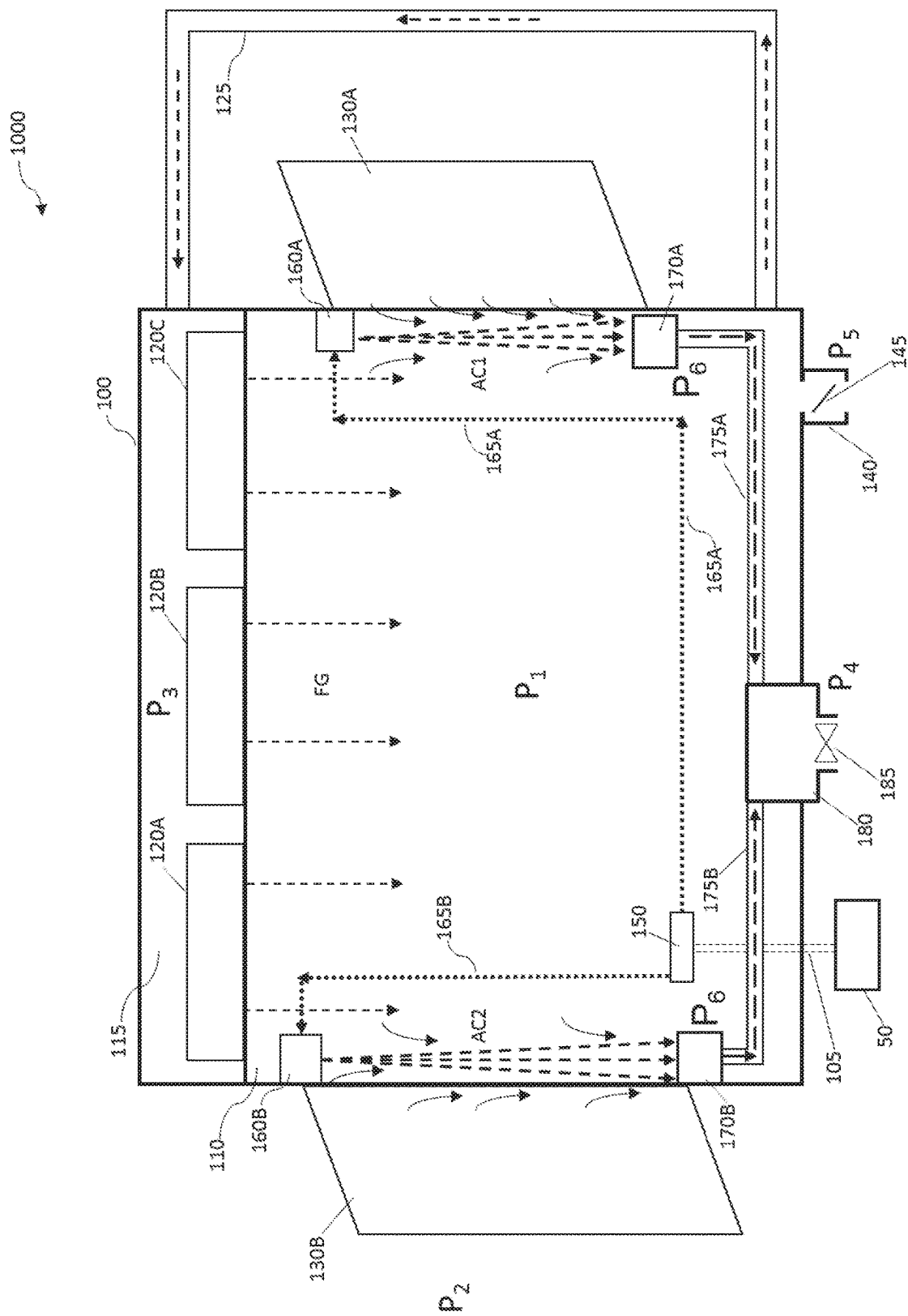
FIG. 1 is a schematic section view of a manufacturing enclosure according to various embodiments of systems and methods of the present teachings.

FIG. 1 illustrates generally manufacturing enclosure system 1000 according to various embodiments of systems and methods of the present teachings. Manufacturing enclosure system 1000 include manufacturing enclosure 100, shown in FIG. 1 including process compartment 110 and fan filter unit (FFU) compartment 115. As will be discussed in more detail herein, various systems can be integrated with manufacturing enclosure system 1000 to provide a controlled process environment within the interior defined by manufacturing enclosure 100.

For example, FFU compartment 115 of manufacturing enclosure 100 can house one or more fan filter units (FFUs), such as FFU 120A, FFU 120B, and FFU 120C, depicted in FIG. 1. Manufacturing enclosure system 1000 can be configured to recirculate gas throughout process compartment 110 and through FFU compartment 115 via gas recirculation loop 125. As such, the continuous recirculation of gas within manufacturing enclosure 100 can provide a process environment of filtered gas (FG) within the controlled environment of manufacturing enclosure 100. Various embodiments of manufacturing enclosure system 1000 of the present teachings can include a gas circulation and filtrations system that can provide a low particle process environment such as to meet, for example, International Standards Organization Standard (ISO) 14644-1:1999, "Cleanrooms and associated controlled environments—Part 1: Classification of air cleanliness," as specified by Class 1 through Class 5.

In addition to providing a controlled low-particle process environment, a process gas for manufacturing enclosure system 1000 can be provided to manufacturing enclosure 100 from external gas source 50, which as will be discussed in more detail herein, can also provide gas to various devices, apparatuses and assemblies within manufacturing enclosure 100. According to various embodiments of manufacturing enclosure system 1000 of the present teachings, a process gas provided by external gas source 50 can be non-reactive with respect to various materials and components used during manufacture of, by way of a non-limiting example, an electronic device. In addition to being intrinsically non-reactive with respect to materials and components during a manufacturing process, such a gas can be specified to and maintained at purity level desirable for a controlled process environment.

In that regard, various embodiments of manufacturing enclosure system 1000 of the present teachings can include a gas purification system that can maintain a specified gas purity level such a levels of reactive species in a process environment. For example, according to the present teachings, a gas purification system integrated with manufacturing enclosure system 1000 can control concentrations of reactive species, such as oxygen, ozone, water vapor, and organic solvents such as to prevent degradation or to inhibit or suppress defects of materials and components used during manufacture processes performed within manufacturing enclosure system 1000. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower.

As depicted in FIG. 1, manufacturing enclosure 100 can have a plurality of openings, such as enclosure opening 130A and 1030B. Manufacturing enclosure 100 of FIG. 1 can have a variety of openings, such as windows, doors and removable panels, that can provide external access to the enclosure interior.

During processing, when such openings are fully sealed, the pressure $P_1$ within process compartment 110 of manufacturing enclosure 100 can be greater than pressure $P_2$, which is a pressure of an environment external to manufacturing enclosure 100. Additionally, pressure $P_3$ within FFU compartment 115 of manufacturing enclosure 100 is less than pressure $P_1$ of process compartment 110 of manufacturing enclosure 100, as gas is circulated from FFU compartment 115 through process compartment 110.

During an operation, such as the non-limiting example of routine maintenance, external access to the interior may necessitate the opening of, for example, enclosure opening 130A and 1030B of manufacturing enclosure 100. The present inventors have recognized that it can be desirable to contain the environment within manufacturing enclosure 100 so as to minimize interaction of an environment external to manufacturing enclosure 100 with the internal environment of manufacturing enclosure 100. For example, it may be desirable to minimize the amount of particulate matter in the external environment that could be carried into the internal environment of manufacturing enclosure 100. Alternatively, by way of non-limiting example, it may be desirable to contain the gas environment within manufacturing enclosure 100, so as to prevent diffusion of gaseous species from an enclosure interior to the external environment.

According to various systems and methods of the present teachings, the internal environment within manufacturing enclosure 100 can be contained by: 1) Controlling pressure $P_1$ of process compartment 110 of manufacturing enclosure 100 of FIG. 1 relative to pressure $P_3$ within FFU compartment 115 and external pressure $P_2$; 2) Providing an exhaust system proximal to each opened enclosure opening for exhausting the gas environment from manufacturing enclosure 100, while the gas environment can be replenished by a gas from gas source 50 and recirculated within manufacturing enclosure 100; and 3) Providing a diffusion barrier between an external environment and an environment internal to manufacturing enclosure 100 with the use of gas curtains at each opened enclosure opening.

According to various systems and methods of the present teachings, at the initiation of a process providing external access to the interior of manufacturing enclosure 100, a non-reactive process gas from gas source 50, such as nitrogen, can be switched to a gas, such as clean dry air (CDA). When a manufacturing enclosure is purged to a specified level of CDA, then openings, such as enclosure opening 130A and 130B of manufacturing enclosure 100, can be opened to allow access to the interior of manufacturing enclosure 100. According to the present teachings, when manufacturing enclosure 100 is opened to the external environment, a slightly negative pressure environment within the enclosure can be created, allowing air from an external environment to be in fluid communication with the environment internal to manufacturing enclosure 100. For example, pressure $P_1$ of process compartment 110 can be controlled to maintain a pressure that can be from between about 0 Pa to about −300 Pa relative to external pressure $P_2$. Controlling pressure $P_1$ of process compartment 110 to a target pressure that is less than the ambient environment can be done by opening throttle valve 145 of enclosure exhaust port 140, opening gate valve 185 of exhaust plenum 180, or reducing the flow rate of CDA circulated through manufacturing enclosure 100, as well as combinations of opening throttle valve 145, opening gate valve 185, and reducing the flow rate of recirculated gas through the manufacturing enclosure.

In conjunction creating a slight negative pressure $P_1$ of process compartment 110, enclosure exhaust ducts positioned proximal to each opening can be activated for exhausting manufacturing enclosure 100. For example, as depicted schematically in FIG. 1, enclosure exhaust duct 170A and 170B can be in fluid communication with exhaust plenum 180 via plenum duct 175A and 175B, respectively. Exhaust plenum 180 can be in fluid communication with a vacuum source (not shown), which when actuated provides exhausting of gas through enclosure exhaust duct 170A and 170B and into a facilities exhaust system (not shown). According to various embodiments of systems and methods of the present teachings, enclosure exhaust ducts positioned proximal to each opening, such as enclosure exhaust duct 170A and 170B of FIG. 1, are proximal to each enclosure opening, and span the full length of where they are located proximal to each opening. For example, as shown in FIG. 1, enclosure exhaust duct 170A and 170B are located under enclosure opening 130A and 130B, respectively, and as will be discussed subsequently in more detail herein, span the length of each opening where they are positioned. According to various embodiments of systems and methods of the present teachings, enclosure exhaust ducts can be located proximal to each enclosure opening, for example, on either lateral side of each enclosure opening, as well as the vertical, as depicted in FIG. 1.

Additionally, in conjunction with creating a slight negative pressure $P_1$ of process compartment 110 and activation of enclosure exhaust ducts positioned proximal to each opening, gas curtain apparatus 160A and 160B, depicted in FIG. 1 as located over enclosure opening 130A and 130B, respectively, can be actuated to provide a sheet flow of gas or gas curtain, depicted in FIG. 1 as AC1 and AC2, that covers the entire area of each enclosure opening 130A and 130B, respectively. Each gas curtain AC1 and AC2 can act as a diffusion barrier between an external environment and the internal environment of manufacturing enclosure 100. Though depicted in FIG. 1 as above each of enclosure opening 130A and 130B, gas curtain apparatuses according to the present teachings can be located proximal to each enclosure opening, for example, on either lateral side of each enclosure opening. Gas curtain apparatus 160A and 160B are in fluid communication with gas intake manifold 150 via a line or conduit such as a polymeric tubing (not shown), depicted as flow path 155A and 155B, respectively. Gas intake manifold 150 is in fluid communication with gas source 50 via line 105, which can be a polymeric tubing. While the interior of manufacturing enclosure 100 remains accessible from an external environment, a gas such as CDA can be used as a source for gas curtain apparatus 160A and 160B. However, it should be noted that during a recovery process in which enclosure openings 130A and 130B are closed, and the internal environment of manufacturing enclosure 100 is returned to the specifications of a controlled process environment, a non-reactive process gas, such as nitrogen, can be used to purge gas curtain apparatus 160A and 160B of CDA.

Accordingly, as discussed in the present teachings related to various embodiments of manufacturing enclosure system 1000 of FIG. 1, during a process requiring external access to the interior of manufacturing enclosure 100, the interior environment of manufacturing enclosure 100 can be contained from an external environment by: 1) Controlling pressure $P_1$ of process compartment 110 of manufacturing enclosure 100 of FIG. 1 relative to pressure $P_3$ within FFU compartment 115 and external pressure $P_2$; 2) Providing an exhaust system proximal to each opened enclosure opening for exhausting the gas environment from manufacturing enclosure 100, while the gas environment can be replenished by a gas from gas source 50 and recirculated within manufacturing enclosure 100; and 3) Providing a diffusion barrier between an external environment and an environment internal to manufacturing enclosure 100 with the use of gas curtains at each opened enclosure opening.

Figure 2:
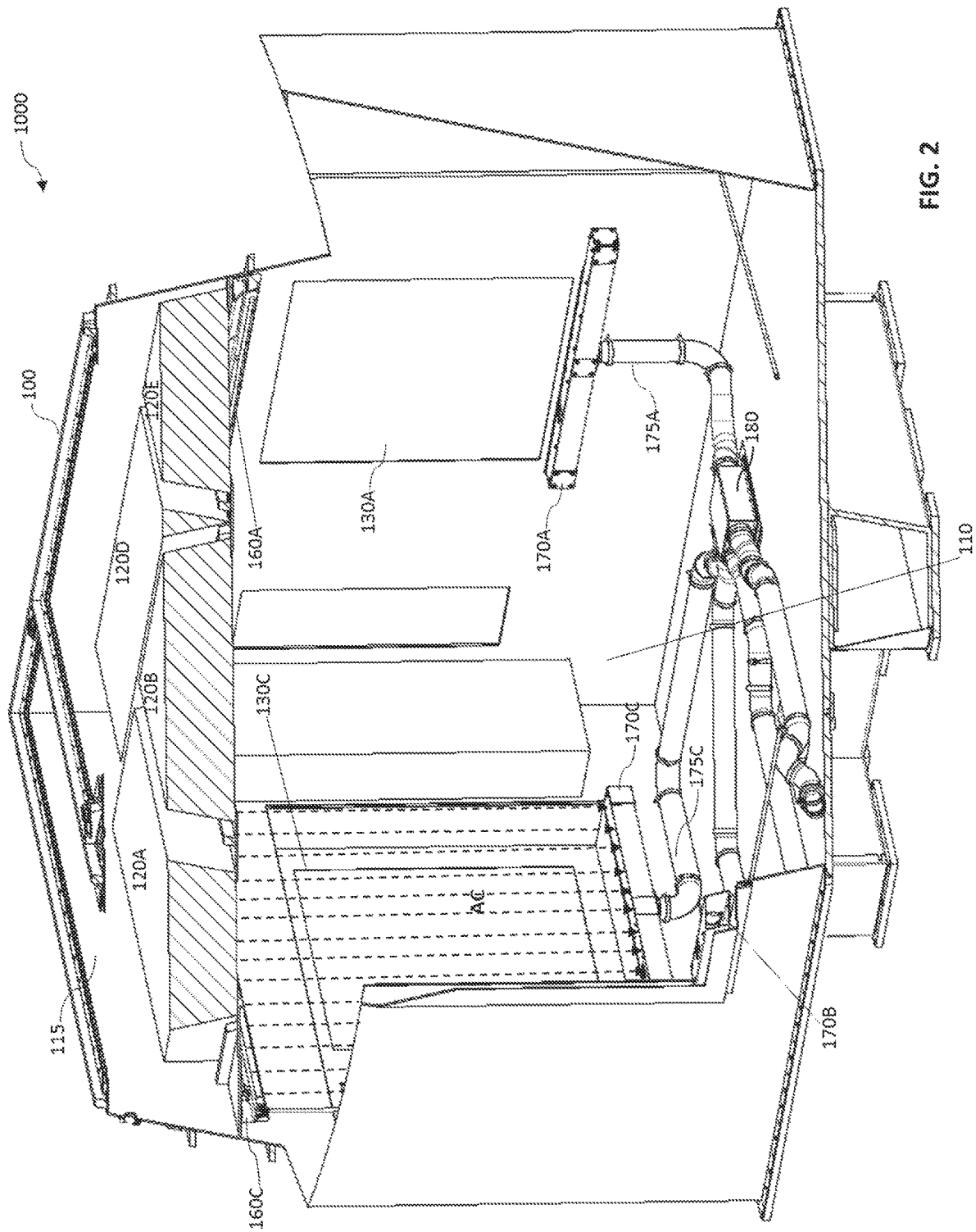
FIG. 2 is an isometric cut-away view of a manufacturing enclosure according to various embodiments of systems and methods of the present teachings.

FIG. 2 is an isometric cut-away view that illustrates generally a perspective view of the interior of manufacturing enclosure system 1000. As previously described for FIG. 2, manufacturing enclosure system 1000 include manufacturing enclosure 100, that can include process compartment 110 and fan filter unit (FFU) compartment 115. As is apparent from the perspective view provided by FIG. 2, FFU compartment 115 can accommodate a plurality of FFUs, which can be arranged to cover the entire footprint of manufacturing enclosure 100. For example, a first set of FFUs, 120A, 120B, and 120C (see FIG. 1), can be placed proximal to a complementary second set of FFUs, of which two of three (120D and 120E) are shown in the perspective cut-away view of manufacturing enclosure 100 of FIG. 2. Such an arrangement of FFUs can provide highly effective filtration of gas over the footprint of manufacturing enclosure 100, providing a substantially low-particle process environment. As previously discussed herein, various systems can be integrated with manufacturing enclosure system 1000 to provide a controlled process environment within the interior defined by manufacturing enclosure 100.

Enclosure openings 130A and 130C of FIG. 2 are shown in their entirety. As previously describe herein, enclosure exhaust duct 170A and 170C of FIG. 2, are proximal to each enclosure opening 130A and 130C, respectively and span the at least the full horizontal length of each opening. Enclosure exhaust duct 170A and 170C of FIG. 2 are in fluid communication with plenum duct 175A and 175C, respectively, which in turn are in fluid communication with exhaust plenum 180. Exhaust plenum 180 can be in fluid communication with a vacuum source (not shown), which when actuated provides exhausting of gas through enclosure exhaust duct 170A and 170B and into a facilities exhaust system (not shown). In a similar fashion, gas curtains of the present teachings can be actuated to provide sheet flow of gas, or gas curtain that covers the entire area of an enclosure opening. Such an gas curtain can act as a diffusion barrier between an external environment and the internal environment of manufacturing enclosure 100. For example, gas curtain apparatus 160A and 160C when actuated can provide a sheet flow of gas covering each enclosure opening, which in FIG. 2 is depicted as a plurality of flow lines designated as AC emanating from gas curtain apparatus 160C and covering the entire area of enclosure opening 130C.

Figure 3:
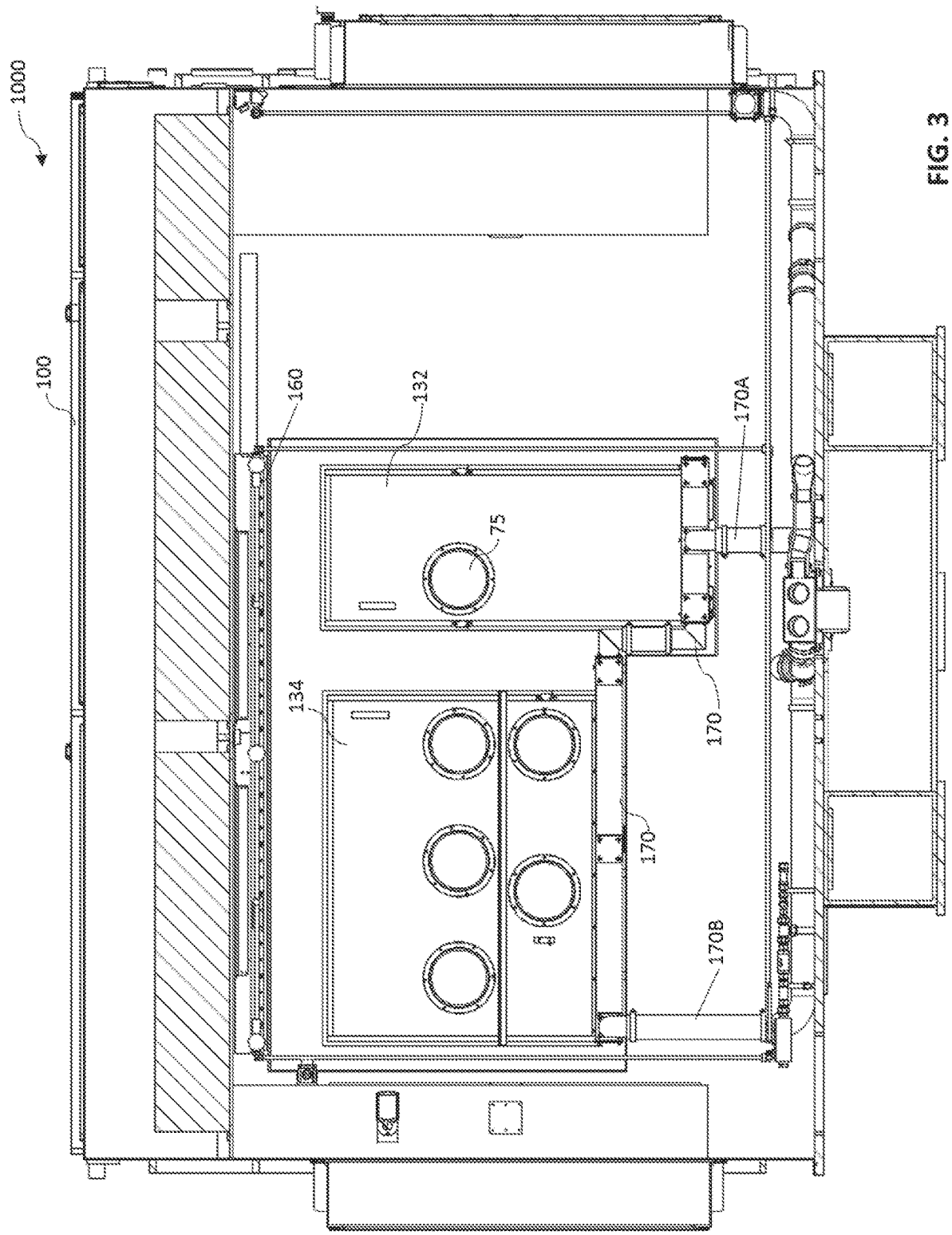
FIG. 3 is an exterior side view of a manufacturing enclosure according to various embodiments of systems and methods of the present teachings.

FIG. 3 is an exterior side view of manufacturing enclosure 1000, which depicts a variety of enclosure openings. As previously discussed herein, manufacturing enclosure 100 of FIG. 3 can have a variety of openings, such as windows, doors and removable panels, which can provide external access to the enclosure interior. For example, manufacturing enclosure 100 can have service door 132 and service window 134, each depicted in FIG. 3 as having at least one glove port, such as glove port 75 of service door 132. Various embodiments of enclosure openings can have at least one glove port that can provide access to the interior of manufacturing enclosure 100 without having to open an enclosure opening. As depicted in FIG. 3, service door 132 and service window 134 can have an gas curtain apparatus 160 that spans the entirety of the combined enclosure openings, and can therefore provide an gas curtain that covers both service door 132 and service window 134 when gas curtain apparatus 160 is actuated Additionally, service door 132 and service window 134 can have an enclosure exhaust duct 170 configured to span the of the combined enclosure openings. Enclosure exhaust duct 170 can be in fluid communication with plenum duct 175A and 17B, which in turn can be in fluid communication with an exhaust plenum (not shown). Plenum duct 175A and 17B are configured to effectively exhaust enclosure exhaust duct 170.

Figure 4:
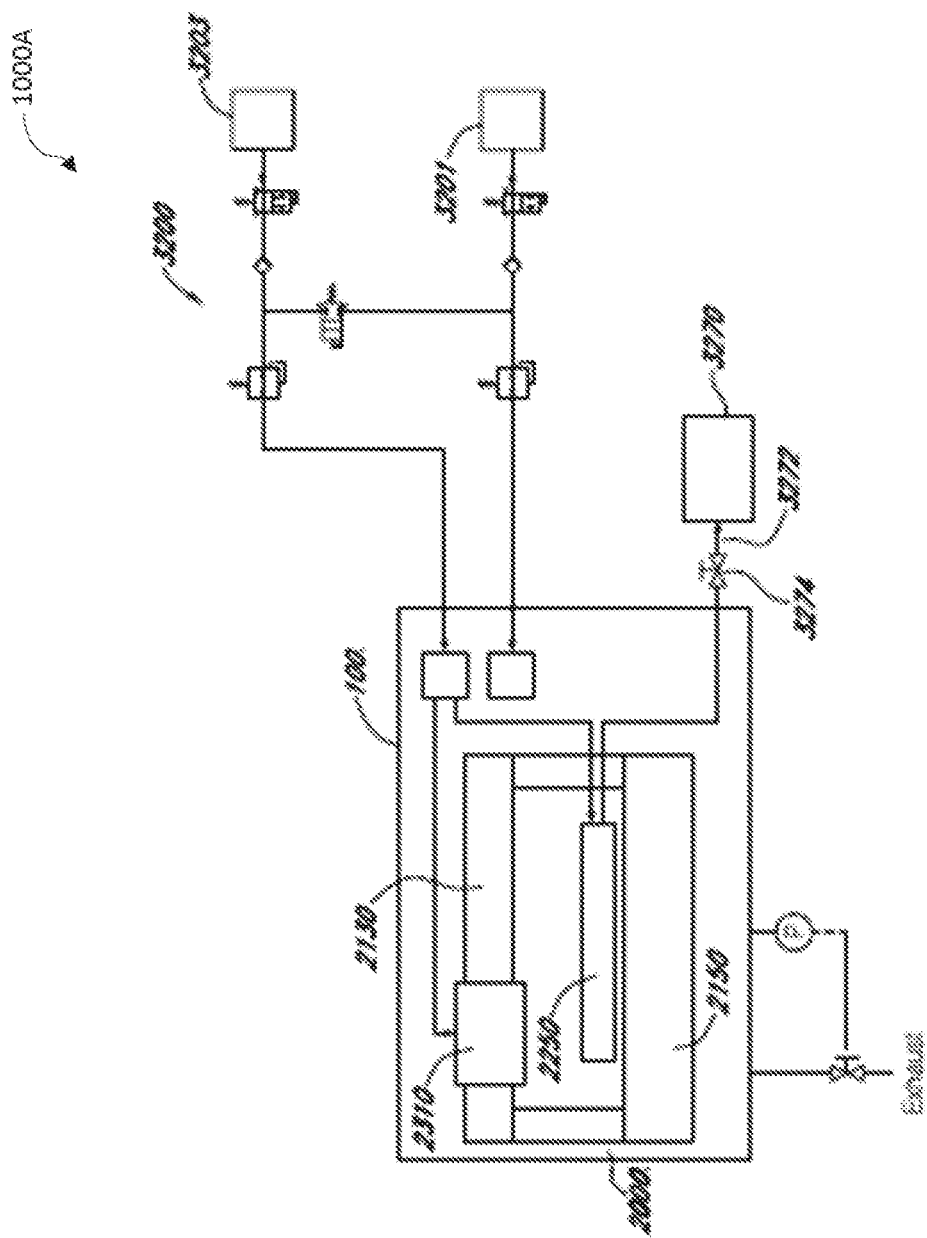
FIG. 4 is an exemplary manufacturing system according to various embodiments of systems and methods of the present teachings.

FIG. 4 illustrates generally an exemplary enclosed inkjet manufacturing system 1000A for integrating and controlling non-reactive gas and clean dry air (CDA) sources such as can be used to establish the controlled environment referred to previously herein, and such as can include a supply of pressurized gas for use with printing system 2000 shown in the interior of manufacturing enclosure 100.

FIG. 4 illustrates generally enclosed inkjet manufacturing system 1000A, for integrating and controlling non-reactive gas source such as can be used to establish the controlled environment referred to in other examples described elsewhere herein, and such as can include a supply of pressurized gas for use with inkjet printing system 2000 shown in the interior of manufacturing enclosure 100. Additionally, enclosed inkjet manufacturing system 1000A of FIG. 4 can include a supply of clean dry air (CDA) so as to establish a CDA environment in manufacturing enclosure 100 during, for example, various maintenance procedures.

As depicted in FIG. 4, enclosed inkjet manufacturing system 1000A can have inkjet printing system 2000, housed within manufacturing enclosure 100. Inkjet printing system 2000 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various embodiments of the present teachings, a substrate support apparatus can be a substrate floatation table, such as substrate floatation table 2250 indicated in FIG. 4. Substrate floatation table 2250 can be used for the frictionless support of a substrate. In addition to a low-particle generating floatation table, for frictionless Y-axis conveyance of a substrate, inkjet printing system 2000 can have a Y-axis motion system utilizing air bushings. Additionally, printing system 2000 can have X,Z-axis carriage assembly 2310, which can be mounted on printing system bridge 2130. X,Z-axis carriage assembly 2310 can have motion control provided by a low-particle generating X-axis air bearing assembly. Various components of a low-particle generating motion system, such as an X-axis air bearing assembly, can be used in place of, for example, various particle-generating linear mechanical bearing systems. For various embodiments of a gas enclosure and system of the present teachings, the use of a variety of pneumatically operated devices and apparatuses can provide low-particle generating performance, as well as being low maintenance.

With respect to supply and control of process gas, as depicted in FIG. 4, various embodiments of enclosed inkjet manufacturing system 1000A can have external gas loop 3200 for integrating and controlling non-reactive gas source 3201 and clean dry air (CDA) source 3203 for use in various aspects of operation of enclosed inkjet manufacturing system 1000A. Enclosed inkjet manufacturing system 1000A can also include various embodiments of an internal particle filtration and gas circulation system, as well as various embodiments of an external gas purification system, as previously described herein. Some commonly used non-limiting examples of gases for non-reactive gas source 3201 gas for can include nitrogen, any of the noble gases, and any combination thereof. Various embodiments of a gas purification system according to the present teachings can maintain levels in manufacturing enclosure 100 for each species of various reactive species, including various reactive atmospheric gases, such as water vapor, oxygen and ozone, as well as organic solvent vapors at 100 ppm or lower, for example, at 10 ppm or lower, at 1.0 ppm or lower, or at 0.1 ppm or lower. In addition to a supply of a non-reactive gas, substrate floatation table 2250 of inkjet printing system 2000, which can utilize air bearing technology, can also utilize vacuum system 3270, which is in communication with of manufacturing enclosure system 1000A through line 3272 when valve 3274 is in an open position.

With respect to controlling the internal pressure of manufacturing enclosure 100, as illustrated generally in FIG. 4, a pressure of gas inside manufacturing enclosure 100 can be maintained within a desired or specified range, such as using a valve coupled to a pressure monitor, P, where the valve allows gas to be exhausted to another enclosure, system, or a region surrounding the inside manufacturing enclosure 100 using information obtained from the pressure monitor. Such gas can be recovered and re-processed. As previously discussed herein, such regulation can assist in maintaining a slight positive internal pressure of inside manufacturing enclosure 100 during a printing process. Moreover, variable demand of various pneumatic devices and apparatuses can create an irregular pressure profile for various manufacturing enclosure systems and methods of the present teachings, which requires constant control and regulation. Accordingly, as depicted in FIG. 4 for manufacturing enclosure 100, the pressure control system is configured to maintaining a dynamic pressure balance for manufacturing enclosure system 1000A, so that it can be held at a slight positive pressure relative to the environment surrounding the enclosure during a printing process.

While the principles of manufacturing systems and methods disclosed herein has been described in connection with specific embodiments, it should be understood clearly that these descriptions are made only by way of example and are not intended to limit the scope of the disclosure. Rather, what has been disclosed herein has been provided for the purposes of illustration and description. It is not intended to be exhaustive or to limit what is disclosed to the precise forms described. Many modifications and variations will be apparent to the practitioner skilled in the art. What is disclosed was chosen and described in order to best explain the principles and practical application of the disclosed embodiments of manufacturing systems and methods described, thereby enabling others skilled in the art to understand the various embodiments and various modifications that are suited to the particular use contemplated. It is intended that the scope of what is disclosed be defined by the following claims and their equivalence.

What is claimed is:

1. A method for maintenance of a manufacturing system comprising:
   during a manufacturing process, circulating a first gas within an interior of an enclosure housing a manufacturing apparatus using a fan filter unit located within a fan filter unit compartment fluidly coupled to the enclosure, wherein the enclosure has at least one barrier that can be moved from an enclosure opening for providing external access to the interior of the enclosure;
   during the manufacturing process, maintaining an enclosure pressure in the interior of the enclosure at a positive pressure relative to a pressure of an ambient environment external to the enclosure and in which the enclosure is located;
   during the manufacturing process, maintaining a compartment pressure of the fan filter unit compartment at a pressure less than the enclosure pressure;
   preparing the interior of the enclosure for a maintenance procedure by circulating a second gas within the interior of the enclosure, the second gas being different from the first gas;
   exposing the interior of the enclosure to the ambient environment external to the enclosure by moving the at least one barrier to provide access to the interior through the enclosure opening to perform the maintenance procedure,
   with the interior of the enclosure exposed to the external ambient environment through the enclosure opening:
      maintaining the interior of the enclosure at a negative pressure relative to the pressure of the ambient environment external to the enclosure;
      providing gas from a gas supply line to establish a curtain of gas across a first two-dimensional area that extends from the gas supply line to an exhaust duct, wherein the curtain of gas creates a diffusion barrier between the external ambient environment and the interior of the enclosure at the enclosure opening; and exhausting the curtain of gas through the exhaust duct.

2. The method of claim 1, wherein the first gas is nitrogen, a noble gas, or a combination of nitrogen and a noble gas.

3. The method of claim 1, wherein the second gas is clean dry air (CDA).

4. The method of claim 3, wherein the first gas is nitrogen, a noble gas, or a combination of nitrogen and a noble gas.

5. The method of claim 1, further comprising, after preparing the interior of the enclosure for the maintenance procedure, accessing the interior of the enclosure through the enclosure opening from the ambient environment external to the enclosure.

6. The method of claim 1, further comprising, during the manufacturing process, maintaining a level of one or more reactive species in the interior of the enclosure at 1000 ppm or lower.

7. The method of claim 6, further comprising, during the manufacturing process, maintaining the level of the one or more reactive species in the interior of the enclosure at 1.0 ppm or lower.

8. The method of claim 6, further comprising, during the manufacturing process, maintaining the level of the one or more reactive species in the interior of the enclosure at 0.1 ppm or lower.

9. The method of claim 6, wherein the one or more reactive species are chosen from water vapor, oxygen, ozone, and an organic solvent.

10. The method of claim 1, wherein moving the at least one barrier to provide access to the interior of the enclosure through the enclosure opening occurs after detecting a level of the second gas in the interior of the enclosure is at a predefined level.

11. The method of claim 1, wherein maintaining the interior of the enclosure at the negative pressure comprises maintaining the interior of the enclosure at a pressure in a range of from about 0 Pa to about −300 Pa relative to the pressure of the ambient environment external to the enclosure.

12. The method of claim 1, wherein maintaining the interior of the enclosure at the negative pressure comprises at least one of opening a throttle valve that is in fluid communication with the exhaust duct, opening a gate valve of an exhaust plenum that is in fluid communication with the exhaust duct, and reducing a flow rate of the second gas in the enclosure.

13. The method of claim 1, wherein the at least one barrier comprises at least one of a window, a door, and a removeable panel removably covering the enclosure opening.

14. The method of claim 1, wherein the manufacturing apparatus comprises an inkjet printing system and the manufacturing process comprises depositing an organic material on a substrate using the inkjet printing system.

15. The method of claim 14, further comprising supporting the substrate during the manufacturing process using a floatation support.

16. The method of claim 14, wherein the manufacturing process is an OLED manufacturing process.

17. The method of claim 1, wherein the first two-dimensional area is larger than a second two-dimensional area that spans the entire enclosure opening.

18. The method of claim 1, wherein the barrier is parallel to the first area when the enclosure opening is closed by the barrier.

19. The method of claim 1, wherein entry into the interior of the enclosure through the enclosure opening occurs in a direction that is substantially perpendicular to a plane that includes the entire first area.

* * * * *